United States Patent [19]
Lo

[11] Patent Number: 5,896,553
[45] Date of Patent: *Apr. 20, 1999

[54] SINGLE PHASE TUNGSTEN-TITANIUM SPUTTER TARGETS AND METHOD OF PRODUCING SAME

[75] Inventor: Chi-Fung Lo, Fort Lee, N.J.

[73] Assignees: Sony Corporation, Tokyo, Japan; Materials Research Corporation, Orangeburg, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/630,155

[22] Filed: Apr. 10, 1996

[51] Int. Cl.$^6$ ........................ B22F 3/12
[52] U.S. Cl. ............ 419/23; 419/32; 419/49; 204/298.13; 420/430
[58] Field of Search .............. 148/407, 423; 420/430; 204/298.13; 419/23, 32, 49

[56] References Cited

U.S. PATENT DOCUMENTS

| | | | |
|---|---|---|---|
| 4,838,935 | 6/1989 | Dunlop et al. | 204/298.13 |
| 5,234,487 | 8/1993 | Wickersham, Jr. et al. | 75/248 |
| 5,306,569 | 4/1994 | Hiraki | 420/430 |
| 5,470,527 | 11/1995 | Yamanobb et al. | 419/32 |
| 5,760,317 | 6/1998 | Kapoor | 420/430 |

OTHER PUBLICATIONS

"Development of W–Ti Binary Alloy Sputtering Target and Study of its Sputtering Characteristics" by Masahiro Yamauchi and Toshizane Kibayashi, Nippon Tungsten Review, vol. 22 (1989) pp. 55–72.

"The Role of Tungsten–Titanium Target Density On Particulate Generation" by J.C. Turn Jr., Ph.D. and Dr. R. Marx, Ph.D., Materials Research Corporation, Advanced Materials Division, Technical Note #1263, 1992.

*Primary Examiner*—George Wyszomierski
*Attorney, Agent, or Firm*—Wood, Herron & Evans, L.L.P.

[57] ABSTRACT

A single phase W-Ti sputter target and a method of manufacturing the target are disclosed. The target is produced by mixing powders of tungsten and titanium and subjecting the mixed powders to a pressing operation for a time, temperature and pressure sufficient to achieve a mutual solid solution of W and Ti, forming single β(Ti,W) phase. The single phase sputtering target emits much less particulate during sputtering than conventional multiphase W-Ti targets of comparable density and composition.

12 Claims, 2 Drawing Sheets

SINGLE PHASE TUNGSTEN-TITANIUM SPUTTER TARGETS AND METHOD OF PRODUCING SAME

FIELD OF THE INVENTION

This invention relates to single phase tungsten-titanium sputtering targets and methods of producing such targets, wherein the targets emit lower amounts of particulate during sputtering than conventional multiple phase targets.

BACKGROUND OF THE INVENTION

In the manufacture of semiconductor devices, alloys of tungsten and titanium are used as diffusion barriers between silicon substrates and aluminum alloy metallizations. The tungsten-titanium ("W-Ti") thin film barriers are formed by sputtering W-Ti targets. In general, these targets are fabricated by mixing starting powders of tungsten and titanium and applying heat and pressure to the mixed powders using a forming method such as inert gas hot pressing, vacuum hot pressing, hot isostatic pressing, and cold pressing/sintering.

One problem associated with known W-Ti targets is particulate emission by the target during sputtering. Particulate generated during sputtering contaminates the thin film and thus negatively affects the reliability and productivity of the thin film generated, causing manufacturing yield losses. Accordingly, there has been considerable interest in evaluating causes of particulate generation during the sputtering of W-Ti targets and minimizing target particulate emission. Because most conventional W-Ti target structures consist of multiple phases, including tungsten, titanium, and $\beta$(Ti,W), most studies have evaluated particulate generation by multiple phase W-Ti targets.

Studies of particulate emission by multiple phase targets have concluded that particulate generation is determined by the method of forming the target, the density of the target, or the percentage of $\beta$(Ti,W) phase in the target structure. For example, early studies indicated that vacuum hot processing was the preferred technique for forming multiple phase targets that produced low particulate during sputtering. Later investigation of multiple phase targets indicated that low particulate generation was a function of a higher target density. U.S. Pat. No. 5,234,487 teaches that decreased particulate emission from multiple phase W-Ti targets can be achieved by having substantially zero $\beta$(Ti,W) phase in the target structure. U.S. Pat. No. 5,234,487 further teaches that $\beta$(Ti,W) phase is responsible for high particulate emission due to the fact that the $\beta$(Ti,W) phase is hard and brittle.

The $\beta$(Ti,W) phase consists of finely dispersed tungsten within titanium. This $\beta$(Ti,W) phase forms by the interdiffusion of W into Ti during high temperature processing of W-Ti target materials and is the result of a solid-state precipitation, a eutectoid reaction. The phase diagram for tungsten-titanium indicates that at temperatures above 740° C., a 10 weight percent titanium alloy will consist of single $\beta$(Ti,W) phase solid solution. To achieve equilibrium for the W-Ti system, the 10 weight present W-Ti alloy must be held at a temperature above 740° C. for a sufficient time to homogenize by diffusion the titanium and tungsten powders. Lower temperatures require longer holding times to achieve equilibrium. Conversely, higher temperatures require less time to achieve equilibrium.

In the manufacture of tungsten-titanium sputtering targets, equilibrium typically is not achieved because tungsten and titanium are not uniform throughout the microstructure of the target. Diffusion of tungsten into regions of titanium tends to produce areas represented by the titanium-rich region of the phase diagram. As these titanium-rich areas cool, the solubility of tungsten in titanium drops, precipitating tungsten. This fine distribution of tungsten in the surrounding titanium is the $\beta$(Ti,W) phase. As a consequence of the failure to achieve equilibrium, a resulting typical multiple phase target microstructure consists of three phases—Ti, W, and $\beta$(Ti,W). The formation of a single $\beta$(Ti,W) phase target has been difficult to accomplish. Consequently, the properties of single phase $\beta$(Ti,W) targets and the parameters affecting particle generation by such targets are not well understood.

Despite the extensive research to better understand the relationship among multiple phase W-Ti target manufacturing processes, microstructure, and particulate emission, there is still a need for a method of producing single $\beta$(Ti,W) phase sputtering targets. Furthermore, there is a need for W-Ti sputter targets that emit less particulate during sputtering than conventional multiple phase W-Ti targets.

SUMMARY OF THE INVENTION

The present invention is premised in part on the unexpected discovery that known information concerning particle emission from multiple phase W-Ti sputtering targets can not be directly correlated, and therefore does not provide a complete understanding of the parameters influencing particle emission by single phase W-Ti sputter targets. Specifically, any conclusions regarding the effect of microstructure and $\beta$(Ti,W) phase content on particle emission for multiphase W-Ti targets must be reevaluated in light of the present invention directed to single phase W-Ti targets.

Accordingly, an objective of this invention is to provide a method of producing a single $\beta$(Ti,W) phase sputtering target. A further objective of the invention is to provide a single $\beta$(Ti,W) phase target that generates lower levels of particulate than conventional multiple phase sputtering targets.

In accordance with the principles of the present invention, a method is provided for forming a single $\beta$(Ti,W) phase sputtering target that generates lower particulate levels than multiple phase W-Ti targets. It is believed that a single $\beta$(Ti,W) phase target generates less particulate during sputtering because the microstructure exhibits much better consolidation between the individual grains than multiple phase targets. Therefore, contrary to the teachings contained in studies of multiple phase W-Ti targets, it has been discovered that a single $\beta$(Ti,W) phase target emits lower levels of particulate during sputtering than conventional multiple phase targets.

In its broadest aspects, the invention provides a method for making a single $\beta$(Ti,W) phase sputtering target by mixing powders of tungsten and titanium. The mixed powders are compacted and heated at an elevated temperature for an extended period of time to create a mutual soluble reaction between the tungsten and titanium powders. The resulting target consists of a substantially single $\beta$(Ti,W) phase material that tends to generate significantly less particles during the sputtering process than multiple phase targets.

Preferably, tungsten and titanium powders are mixed and the weight percent of titanium powder present is in the range of about 1% to 99%. More preferably, in the case of sputtering targets used for making diffusion barriers between silicon substrates and aluminum alloy metallizations, the weight percent of titanium powder present is in the range of about 1% to 30%. Most preferably, for targets used in making these diffusion barriers, titanium is present in the amount of approximately 10 weight percent.

After mixing, the powders are compacted and heated simultaneously, preferably in a hot press. The hot pressing may occur using a graphite die and in the presence of an inert gas atmosphere. Pressures from about 0.5 kpsi to 40 kpsi are utilized for compaction, and heating occurs at temperatures from about 1300° C. to 1650° C. The compaction and heating steps are performed for a period of time from about 3 to 6 hours. When a hot press is used, the compaction pressure is approximately 1 kpsi. In the case where compaction is performed using a hot isostatic press, the pressure may reach approximately 40 kpsi. Vacuum hot pressing may also be utilized to compact and heat the powders.

To form a 10 weight percent W-Ti target having substantially a single β(Ti,W) phase, the starting powders are heated from about 1300° C. to about 1650° C., depending on the starting particle size of the tungsten and titanium powders. For example, to form a single β(Ti,W) phase target having 10 weight percent titanium and using tungsten powder of an average particle size of 5 microns and titanium powder with an average particle size of 30 microns, the powders should be hot pressed at about 1630° C. and about 1 kpsi for approximately 3 hours. For larger particle sizes and temperatures lower in the 1300° C. to 1650° C. range, the compaction and heating steps must be performed simultaneously for a longer period of time, preferably less than 6 hours.

After a target blank has been formed by pressing at an elevated temperature and pressure, the blanks are machined to a desired target shape using conventional tooling techniques that are well known in the art.

These and other objectives and advantages of the present invention will be more readily understood in view of the following detailed description of the invention.

DETAILED DESCRIPTION OF THE INVENTION

Single β(Ti,W) phase W-Ti sputter targets that emit less particulate during sputtering than conventional multiple phase W-Ti targets are formed in accordance with the principles of the present invention. W-Ti sputter targets that are used for making diffusion barriers between silicon substrates and aluminum alloy metallizations typically have 1 to 30 weight percent titanium. More preferably, W-Ti targets used for making diffusion barriers between silicon and aluminum alloy metallizations have approximately 10 weight percent titanium. For other applications using W-Ti alloys, the weight percent of titanium may vary from 1% percent to 99%.

In accordance with the present invention, single β(Ti,W) phase W-Ti sputtering targets having 10 weight percent titanium have been produced. However, it is to be understood that the invention is not limited to W-Ti targets of ten weight percent, and the weight percent of titanium in the W-Ti target may vary from one weight percent to ninety-nine weight percent. Moreover, it is also contemplated that various metal alloy single phase targets may be manufactured in accordance with the principles of this invention using other metal powders, including Ti-V, Ti-U, and Ti-Ta alloys.

Figure 1:
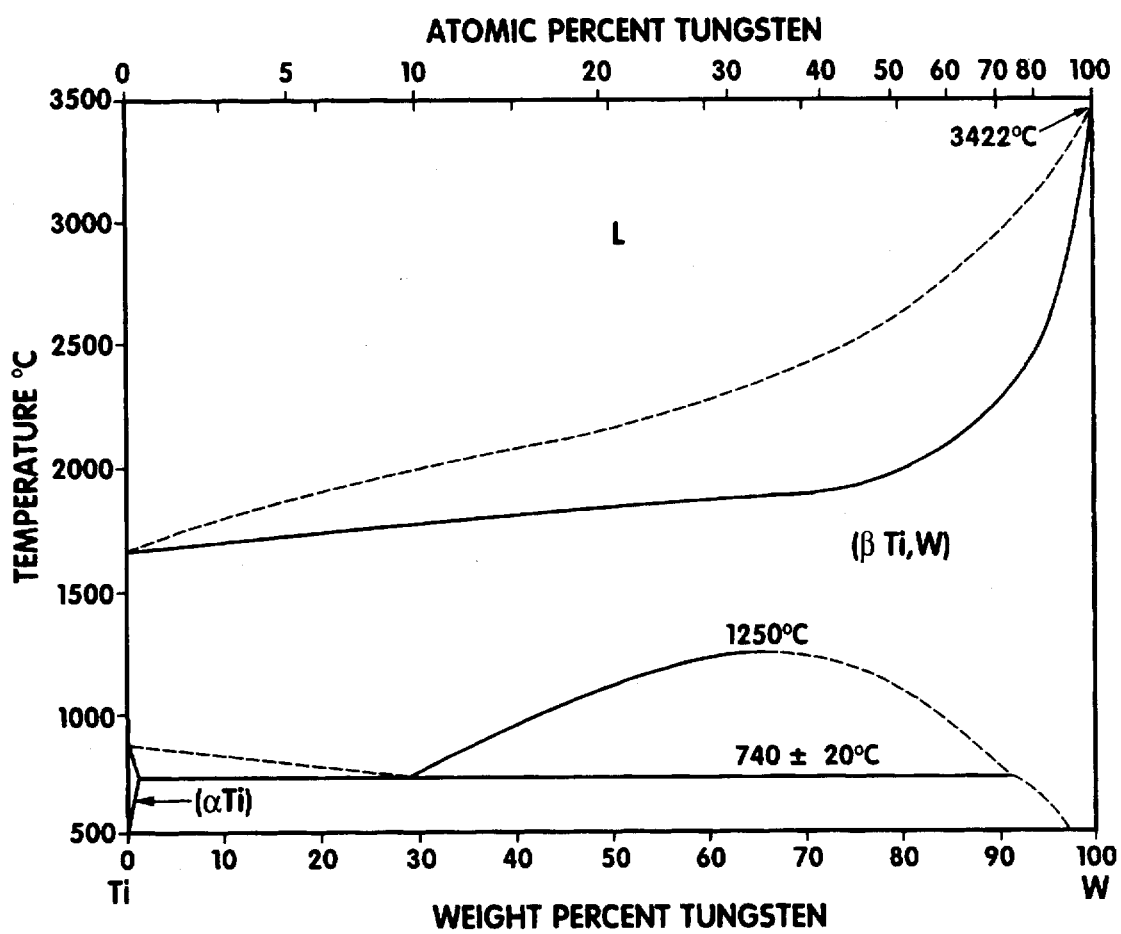
FIG. 1 is a phase diagram of tungsten-titanium binary alloy.

A study of the W-Ti phase diagram facilitates an understanding of the formation of β(Ti,W) phase. FIG. 1 shows a binary alloy phase diagram for the tungsten-titanium alloy, taken from Massalski, Binary Alloy Phase Diagrams Vol. 2, ed. T. B. Massalski, ASM International, Metals Park, Ohio, p. 2136 (1986). The phase diagram indicates that for a 10 weight percent titanium alloy, the β(Ti,W) phase forms at temperatures above 740° C.±20° C. According to the principles of the present invention, a single β(Ti,W) phase target is formed by compacting a mixture of titanium and tungsten powders at a temperature, pressure and period of time sufficient to achieve a mutual solid solution of tungsten and titanium.

A mutual solid solution of tungsten and titanium promotes diffusion to homogenize distinct regions of titanium and tungsten that exist in the original powders. The original tungsten and titanium particles completely lose their individual identity and form a single β(Ti,W) phase. Scanning electron microscope analysis of the microstructure of a target is used to determine if the target microstructure consists of multiple phases of W, Ti, and β(Ti,W), or if a single β(Ti,W) phase has been formed.

Figure 2:
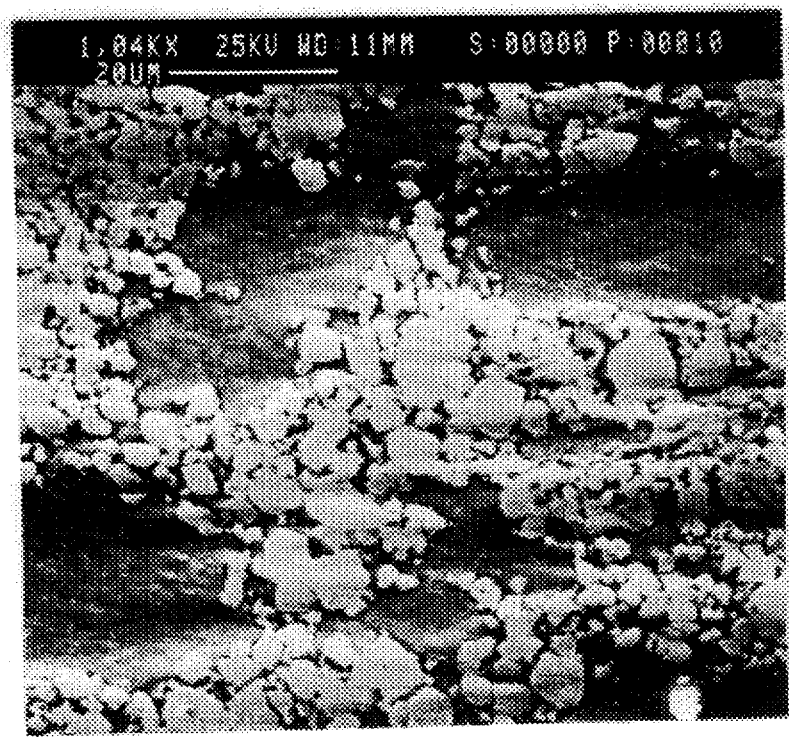
FIG. 2 is 1.04 kX photomicrograph of a tungsten-10 weight percent titanium conventional multiple phase sputtering target.

FIG. 2 shows a 1.04 kX scanning electron microscope (SEM) photomicrograph of a conventional multiple phase W-Ti sputtering target microstructure. The dark, light, and intermediate regions in the photomicrograph indicate three distinct phases representing the titanium phase, the tungsten phase, and β(Ti,W) phase. This microstructure has poor consolidation among the grains of these three distinct phases. It is believed that this poor consolidation among the grains promotes particulate generation during sputtering and causes defects in sputtered films.

Figure 3:
FIG. 3 is a 1.06 kX photomicrograph of a tungsten-10 weight percent titanium single phase sputtering target of the present invention.

FIG. 3 shows a 1.06 kX SEM photomicrograph of a single β(Ti,W) phase W-Ti sputtering target microstructure prepared in accordance with the principles of the present invention. The photomicrograph shows a distinct single phase, free of voids and having better consolidation between the grains than the microstructure of the multiple phase target shown in FIG. 2. This smoother microstructure unexpectedly results in a W-Ti sputtering target that generates much lower levels of particulate than conventional multiple phase sputtering targets.

According to the present invention, formation of a single β(Ti,W) phase target may be achieved by varying the parameters for consolidation and heating of mixed powders of tungsten and titanium. Preferably, formation of single β(Ti,W) phase is achieved by controlling the temperature, pressure and time conditions under which the starting powders are compacted and heated. For a 10 weight percent titanium mixture of titanium and tungsten powder, it is preferred to heat the mixture from a temperature of about 1300° C. to 1630° C. A pressure of 0.5 kpsi to 40 kpsi is applied simultaneously with the heating of the powder mixture. The temperature and pressure should be maintained for at least three hours to achieve a mutual solid solution of tungsten and titanium.

The particle sizes of the tungsten and titanium powders may be varied in accordance with the principles of the present invention. Larger particle sizes, however, will require higher processing temperatures and longer processing times to achieve a single β(Ti,W) phase target. Preferably, the average particle size of the tungsten powder is in the range of 1 to 50 microns and the average particle size of the titanium powder is in the range of 5 to 100 microns. More preferably, the average particle size of the tungsten is about 1 to 20 microns and the average particle size of the titanium is about 5 to 50 microns. Most preferably, the average particle size of the tungsten powder is approximately 5 microns and the average particle size of the titanium powder is approximately 30 microns. Both the tungsten and titanium should be high purity powders, with the tungsten powder having about 99.999% purity and the titanium powder being about 99.99% pure.

Prior to sintering the mixed powders under pressure, the tungsten and titanium powders are mixed. Mixing occurs in accordance with powder blending techniques that are well known in the art. For example, mixing may occur by placing the tungsten and titanium powders in a dry cylindrical container with a high purity ceramic cylindrical media and rotating the container about its central axis. A person of ordinary skill in the art will realize that a ball mill or similar apparatus may be utilized to accomplish the mixing step. However, this invention is not limited to any particular mixing technique, and a person of ordinary skill in the art may select other mixing techniques that will sufficiently blend the tungsten and titanium starting powders.

The mixed powder is then consolidated into a desired target shape by sintering the powder particles together, preferably in an inert gas atmosphere. Consolidation of the blended tungsten and titanium powder may be achieved by various well-known pressing techniques, such as inert gas uniaxial hot pressing, vacuum hot pressing, and hot isostatic pressing. Preferably, according to the present invention, single β(Ti,W) phase W-Ti sputtering targets are produced using an inert gas hot press having a graphite die set. Finished sputter targets of the present invention have a density of greater than about 90% theoretical density and preferably at least 95% of theoretical density. A person of ordinary skill in the art will realize that any conventional hot press will be able to produce the single β(Ti,W) phase W-Ti sputtering targets of the present invention, so long as the appropriate temperature, pressure and time conditions are maintained.

Sintering of the tungsten and titanium powders in a hot press to form a single β(Ti,W) phase target requires heating the powders to a temperature of at least 1300° C. but not greater than 1650° C. while simultaneously applying a pressure of approximately 1 kpsi. For temperatures in the low end of the 1300° C. to 1650° C. range, longer holding times will be required for the single β(Ti,W) phase to form. As discussed above, tungsten and titanium powders having larger particle sizes will also increase the time required to sinter the powders to a single phase. In accordance with the principles of the present invention, for a 10 weight percent W-Ti target using a tungsten powder having an average particle size of 5 microns and a titanium powder having an average particle size of 30 microns, a single β(Ti,W) phase target was formed in an inert gas hot press by holding the powders at a temperature of about 1630° C. and 1 kpsi pressure for 3 hours. Presence of a single phase was confirmed by examining the microstructure of the target with a Scanning Electron Microscope and confirming that the microstructure showed a distinct single phase free of voids, similar to the microstructure shown in FIG. 3.

After the targets are hot pressed and cooled, they are typically machined to the desired shape according to principles well known in the art. In the following example, after machining, conventional 10 weight percent titanium multiple phase W-Ti targets and a 10 weight percent titanium single β(Ti,W) phase target prepared according to the principles of the present invention were used to generate thin films on wafers. Particle emission data for multiple phase targets and single phase targets was collected and compared. As illustrated by the following example, the single β(Ti,W) phase target prepared according to the principles of the present invention unexpectedly emitted much lower particulate levels than conventional multiple phase W-Ti targets.

EXAMPLE

The following non-limiting example provides a comparison of particulate data for conventional multiple phase targets and the single β(Ti,W) phase target.

The goal of this experiment was to demonstrate that a single β(Ti,W) phase target emits much lower levels of particulate than conventional multiphase W-Ti targets. To this end, four 10 weight percent titanium multiple phase W-Ti targets were prepared, and a 99.7% theoretical density multiple phase W-Ti target was selected. A single β(Ti,W) phase target was also prepared. Confirmation of single phase or multiple phase microstructure was performed using a scanning electron microscope. The density of each sample was measured using the Archimedes method. Each target was used to deposit a 1350 Å film on silicon wafers. Particle densities were measured and compared for films generated by each target.

Sample 1, the 99.7% (theoretical density) 10 weight percent titanium multiple phase W-Ti target was obtained from a W-Ti target supplier. This sample was prepared by vacuum hot pressing. Samples 2, 3, 4 and 5 were all prepared in the same manner as follows. Tungsten powder having an average particle size of 5 microns and 99.999% purity was mixed with 10 weight percent titanium powder having an average particle size of 30 microns and 99.99% purity. Mixing occurred in a ball mill. After mixing, targets have multiple phases were produced by hot pressing the powders together in an inert gas atmosphere at 1 kpsi and 1300° C. for 3 hours. The microstructure of the multiple phase samples 1, 2, 3, 4, and 5 all resembled the microstructure shown in FIG. 2, confirming the presence of three phases.

The 10 weight percent titanium single β(Ti,W) phase sample was prepared by using the same tungsten and titanium powders as samples 2, 3, 4, and 5, and mixing in the same ball mill. After mixing, the single β(Ti,W) phase target was formed by hot pressing the powders at 1 kpsi and 1630° C. for 3 hours. FIG. 3, which is a 1.06 kX SEM microphotograph of the single β(Ti,W) phase sample shows the microstructure of the sample as having a single phase. The formation of the single phase was produced by processing the powders at a higher temperature than the multiple phase targets, but for the same amount of time. A person of ordinary skill in the art could vary the temperature, time, and pressure parameters to obtain a single phase target. For example, a processing temperature lower than 1630° C. would require a holding time longer than 3 hours to form the single phase. Formation of the single phase can be confirmed by examining the microstructure with a Scanning Electron Microscope.

Each of the samples was machined to a desired target configuration. After machining, each sample was used to deposit a 1350 Å thick film on a 12.7 centimeter diameter silicon wafer at a temperature of 200° C. For each target sample, films were formed on a minimum of six wafers. The distance between the wafer and target was 4.3 centimeters and the sputtering pressure was 5.5 mTorr.

Particle density on each of the wafers processed was measured using a Tencor Surfscan 6200 surface particle counter. For each sample target, particle densities were measured on a minimum of six wafers. Results shown in Table I indicate that the film produced by the single β(Ti,W) phase sample had a much lower particle density than any of the multiple phase samples.

TABLE I

| Sample | Density (% theoretical) | Particle Density (Particles/cm²) |
| --- | --- | --- |
| Single Phase | 98.7 | 0.0007 |
| Multiphase Sample 1 | 99.7 | 0.0118 |
| Multiphase Sample 2 | 98.9 | 0.0144 |
| Multiphase Sample 3 | 98.4 | 0.0144 |
| Multiphase Sample 4 | 98.2 | 0.1037 |
| Multiphase Sample 5 | 96.7 | 0.0743 |

The preceding example reveals that the multiphase targets all produced approximately the same amount of particulate in the thin films during sputtering, while the single phase sample emitted a much lower level of particulate. This was also true for the multiphase samples that had either higher densities or densities that were nearly the same as the single phase sample. Thus, the present invention demonstrates that a single β(Ti, W) target emits much lower levels of particulate during sputtering than conventional multiple phase targets.

The above disclosure provides the general principles of the present invention and specific details thereof. Persons skilled in the art will readily understand that the invention is not limited thereby, however, and that various alternatives will be apparent to such persons. Accordingly, it is to be understood that changes may be made without departing from the scope of the invention as particularly set forth and claimed.

What is claimed is:

1. A method of making a single β(Ti,W) phase tungsten-titanium sputter target, the method comprising the steps of:

mixing components consisting essentially of:
   a tungsten powder having an average particle size of about 5 microns, and
   a titanium powder having an average particle size of about 30 microns, wherein
   the titanium powder is present in an amount in the range of one to thirty weight percent with the balance being tungsten powder;

compacting the mixed components in a hot press in an inert gas environment at a pressure in the range of about 0.5 kpsi to 40 kpsi while heating the mixed components at a temperature of about 1630° C. for a time of about 3 hours.

2. The method of claim 1 wherein the compacting and heating steps are performed in a hot isostatic press.

3. The method of claim 1 wherein step compacting and heating steps are performed in a vacuum hot press.

4. A method of making a single β(Ti,W) phase tungsten-titanium sputter target, the method comprising the steps of:

mixing a tungsten powder having an average particle size of about 5 microns with a titanium powder having an average particle size of about 30 microns, with the titanium powder being present in an amount in the range of one to thirty weight percent with the balance being tungsten;

compacting the mixed components in a hot press in an inert gas environment at a pressure in the range of about 0.5 kpsi to 40 kpsi while heating the mixed components at a temperature from above 1600° C. to not more than about 1650° C. for a sufficient period of time to create a mutual solid solution of tungsten and titanium to produce a resulting target that consists of single β(Ti, W) phase material of substantially uniform composition of from 1 to 30 percent by weight titanium.

5. The method of claim 4 wherein:
   the titanium powder is present in an amount of approximately 10 weight percent titanium, the remainder being essentially tungsten powder.

6. The method of claim 5 wherein:
   the target produced has a density of at least about 95% of theoretical density.

7. A method of making a single β(Ti,W) phase tungsten-titanium sputter target, the method comprising the steps of:

mixing a tungsten powder having an average particle size from about 1 micron to about 20 microns with a titanium powder having an average particle size from about 5 microns to about 50 microns, with the titanium powder being present in an amount in the range of one to thirty weight percent with the balance being tungsten;

compacting the mixed components in a hot press in an inert gas environment at a pressure in the range of about 0.5 kpsi to 40 kpsi while heating the mixed components at a temperature from above 1600° C. to not more than about 1650° C. for a sufficient period of time to create a mutual solid solution material of a substantially uniform composition of tungsten and titanium that consists of single β(Ti,W) phase of from 1 to 30 percent by weight titanium; and forming a sputtering target of the material.

8. The method of claim 7 wherein the compacting and heating steps are performed in a hot isostatic press.

9. The method of claim 7 wherein step compacting and heating steps are performed in a vacuum hot press.

10. The method of claim 7 wherein:
    the titanium powder is present in an amount of approximately 10 weight percent titanium, the remainder being essentially tungsten powder.

11. The method of claim 7 wherein:
    the target produced has a density of at least about 95% of theoretical density.

12. The method of claim 7 further comprising the step of:
    after the heating step is performed for the sufficient period of time, terminating the heating and allowing the mixture to cool to ambient temperature.

* * * * *

UNITED STATES PATENT AND TRADEMARK OFFICE
CERTIFICATE OF CORRECTION

PATENT NO.   : 5,896,553
DATED        : April 20, 1999
INVENTOR(S)  : Chi-Fung Lo It is certified that error appears in the above-identified patent and that said Letters Patent is hereby corrected as shown below:

In Table 1, Column 7, under Particle Density, the next to the last number reads "0.1037" and should read --0.0118--.

Signed and Sealed this

Twenty-seventh Day of March, 2001

Attest:

NICHOLAS P. GODICI

*Attesting Officer*    Acting Director of the United States Patent and Trademark Office